(12) United States Patent
Stiurca

(10) Patent No.: US 10,528,324 B2
(45) Date of Patent: Jan. 7, 2020

(54) VIRTUAL HYBRID FOR FULL DUPLEX TRANSMISSION

(71) Applicant: Microsemi Storage Solutions, Inc., Aliso Viejo, CA (US)

(72) Inventor: Dan Stiurca, Austin, TX (US)

(73) Assignee: Microsemi Storage Solutions, Inc., Chandler, AZ (US)

( * ) Notice: Subject to any disclaimer, the term of this patent is extended or adjusted under 35 U.S.C. 154(b) by 50 days.

(21) Appl. No.: 15/784,981

(22) Filed: Oct. 16, 2017

(65) Prior Publication Data

US 2018/0107452 A1    Apr. 19, 2018

Related U.S. Application Data

(60) Provisional application No. 62/410,254, filed on Oct. 19, 2016.

(51) Int. Cl.
| | | |
|---|---|---|
| *G06F 7/501* | (2006.01) | |
| *G06F 5/01* | (2006.01) | |
| *H03K 17/687* | (2006.01) | |
| *H04L 5/14* | (2006.01) | |
| *H04B 1/16* | (2006.01) | |

(52) U.S. Cl.
CPC ............... *G06F 7/501* (2013.01); *G06F 5/01* (2013.01); *H03K 17/687* (2013.01); *H04L 5/1461* (2013.01); *H04B 1/16* (2013.01)

(58) Field of Classification Search
CPC .................................................. H04L 5/1461
See application file for complete search history.

(56) References Cited

U.S. PATENT DOCUMENTS

| 4,551,636 | A | * | 11/1985 | Andrews | ............... | G01R 15/08 |
| | | | | | | 326/62 |
| 5,726,563 | A | * | 3/1998 | Bolton, Jr. | .............. | G05F 3/267 |
| | | | | | | 323/313 |
| 5,963,638 | A | * | 10/1999 | Sheets | .................... | H04B 1/586 |
| | | | | | | 379/345 |

(Continued)

OTHER PUBLICATIONS

International Search Report and Written Opinion dated Dec. 19, 2017, issued by the European Patent Office for related international patent application PCT/US2017/056815.

(Continued)

*Primary Examiner* — Hashim S Bhatti
*Assistant Examiner* — Abdullahi Ahmed
(74) *Attorney, Agent, or Firm* — Glass and Associates; Kenneth Glass

(57) ABSTRACT

Various transmission systems may benefit from techniques to improve the quality of the transmission. For example, certain full duplex transmission systems may include a virtual hybrid coupler. A circuit can include a first feedback resistor. The circuit can also include a second feedback resistor coupled to the first feedback resistor. The circuit can further include a first set of M transistors coupled to the first feedback resistor. The circuit can additionally include a second set of N transistors coupled to the second feedback resistor and to the first set of M transistors. The circuit can be configured to cancel a transmitted signal at a receiver input based on a ratio of resistance values of the first feedback resistor and the second feedback resistor, and based on a ratio of M to N.

19 Claims, 2 Drawing Sheets

(56) References Cited

U.S. PATENT DOCUMENTS

| | | | |
|---|---|---|---|
| 6,343,024 B1 * | 1/2002 | Zabroda | H04L 25/0266 |
| | | | 323/208 |
| 8,120,390 B1 * | 2/2012 | Mack | G05F 1/575 |
| | | | 327/108 |
| 9,246,390 B2 * | 1/2016 | Lopata | H02M 3/1588 |
| 2006/0035611 A1 * | 2/2006 | Connell | H03D 7/1441 |
| | | | 455/209 |
| 2007/0008035 A1 * | 1/2007 | Liu | H03F 1/483 |
| | | | 330/253 |
| 2007/0146047 A1 * | 6/2007 | Senriuchi | G01D 3/036 |
| | | | 327/512 |
| 2007/0205806 A1 * | 9/2007 | Ishikawa | H03K 19/0185 |
| | | | 326/83 |
| 2007/0206775 A1 | 9/2007 | Holzmann | |
| 2008/0284395 A1 * | 11/2008 | Wang | G05F 1/56 |
| | | | 323/282 |
| 2011/0101948 A1 * | 5/2011 | Lopata | H02M 3/1588 |
| | | | 323/283 |
| 2013/0003616 A1 * | 1/2013 | Chan | H04B 1/586 |
| | | | 370/276 |
| 2016/0013766 A1 * | 1/2016 | Kobayashi | H03F 3/245 |
| | | | 455/78 |
| 2018/0107315 A1 * | 4/2018 | Lee | G02F 1/13338 |

OTHER PUBLICATIONS

Pan, Yao, Hammad, Tan, Abdelhalim, Wang, Hsu, Tam, Fujimori; A Full-Duplex Line Driver for Gigabit Ethernet With Rail-toRail Class-AB Output Stage in 28 nm CMOS; IEEE Journal of Solid-State Circuits, vol. 49, No. 12, Dec. 2014; p. 3141-3155.

* cited by examiner

VIRTUAL HYBRID FOR FULL DUPLEX TRANSMISSION

CROSS REFERENCE TO RELATED APPLICATION

This application claims full benefit of and priority to U.S. Provisional Patent Application No. 62/410,254, filed Oct. 19, 2016, titled "VIRTUAL HYBRID FOR FULL DUPLEX TRANSMISSION", the disclosure of which is hereby fully incorporated by reference for all purposes.

BACKGROUND

Field

Various transmission systems may benefit from techniques to improve the quality of the transmission. For example, certain full duplex transmission systems may include a virtual hybrid coupler.

Description of the Related Art

Various communication systems employ full duplex communications. For example, full duplex communications can occur over copper (Cu) lines. For example, at a physical layer (PHY) full duplex communications can include 1000 BT, 2.5 G, 5 G, and 10 G Ethernet.

In full duplex communications over copper lines, both transmit and receive signals can be sent on the same transmission line pair at the same time. Since both transmit and receive signals are on the same transmission line pair at the same time, a mechanism may be required to remove or minimize the transmitted signal from the device, at the device receive path.

Conventionally, a solution to address this issue is to cancel out the transmit signal from the input of the receiver in a full duplex transmission using a resistive bridge hybrid coupler. In order to do that, at least one internal node swings more than the line amplitude. Typically, the voltage swing at that internal node is approximately twice the required line amplitude.

The low voltage power supply of nm CMOS technologies is now lower than the necessary voltage swing. For example, the typical power supply for 28 nm technology is 1.8 V and the necessary voltage swing is 2 V for 1000 BT speed. Practically, this implies that the standard resistive bridge architecture cannot be used under the low power supply constraints of nm complementary metal-oxide-semiconductor (CMOS) technology.

Another option would be to employ a transform-based hybrid solution. This approach relies on magnetic techniques. However, this approach is rarely used at Gigabit speeds. The main reasons are that such an approach is bulky, expensive, and provides mediocre cancellation.

SUMMARY

According to certain embodiments, a circuit can include a first feedback resistor. The circuit can also include a second feedback resistor coupled to the first feedback resistor. The circuit can further include a first set of M transistors coupled to the first feedback resistor. The circuit can additionally include a second set of N transistors coupled to the second feedback resistor and to the first set of M transistors. The circuit can be configured to cancel a transmitted signal at a receiver input based on a ratio of resistance values of the first feedback resistor and the second feedback resistor, and based on a ratio of M to N.

In certain embodiments, a method can include receiving a transmission signal. The method can also include matching a line resistance of a reception line using a first feedback resistor and a ratio of transistor sets. The method can further include canceling the transmission signal on the reception line using a ratio of a second feedback resistor to the first feedback resistor.

BRIEF DESCRIPTION OF THE DRAWINGS

For proper understanding of the invention, reference should be made to the accompanying drawings, wherein.

DETAILED DESCRIPTION

Certain embodiments of the present invention provide a circuit architecture that can generate a standard compliant signal into a transmission line and can cancel out a transmitted signal at a receiver input under low power supply constraints associated with modern nm CMOS technologies.

For example, according to certain embodiments of the present invention, no internal node is required to swing more than the maximum amplitude required by the standard specifications into the transmission line. Thus, certain embodiments of the present invention can provide a circuit architecture that can work under low voltage requirements. The low voltage requirement may be on the order of, for example, 2 V or any other desired voltage.

Figure 1:
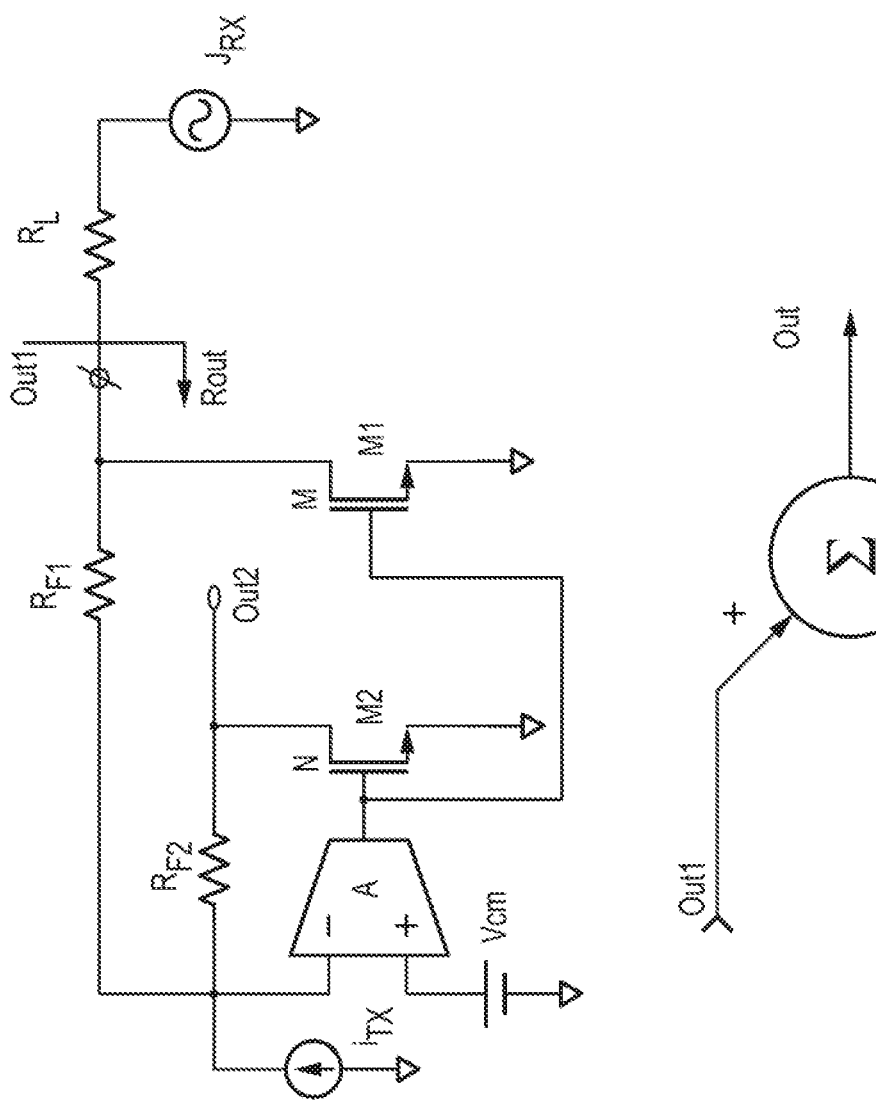
FIG. 1 illustrates a simplified schematic of a virtual hybrid according to certain embodiments of the present invention.

FIG. 1 illustrates a simplified schematic of a virtual hybrid according to certain embodiments of the present invention. It is single ended, with N only implementation. Depending on the application, P only, push-pull and/or differential versions can be implemented.

In FIG. 1, A is an amplifier. The amplifier can be an operational transconductance amplifier (OTA), an operational amplifier (OpAmp) or any other desired amplifier. M1 and M2 may be metal oxide semiconductor (MOS) transistors built up using M and N unit transistors in parallel, respectively.

Moreover, in FIG. 1, $R_{F1}$ and $R_{F2}$ are two feedback resistors. $R_L$ is the characteristic impedance associated with the transmission line and with the receive partner. $V_{CM}$ is the common mode bias voltage.

In FIG. 1, $i_{TX}$ is the transmit signal that usually is the output of a conventional digital-to-analog converter (DAC). The received signal can be $v_{RX}$. Circuit k is a scaling circuit with a scaling factor of k. Capital sigma ($\Sigma$) is a summing circuit.

Using standard circuit analysis techniques, the output resistance at node Out1, $R_{out}$, can be expressed as in Equation 1.

$$R_{out} = \frac{1}{1 + \frac{M}{N}} R_{F1} \qquad \text{Equation 1}$$

Now, if Equation 2 holds, the output resistance is set to the value of the characteristic resistance R1, as in Equation 3.

$$R_{F1} = \left(1 + \frac{M}{N}\right)R_L \qquad \text{Equation 2}$$

$$R_{out} = R_L \qquad \text{Equation 3}$$

In this way, the output resistance of the circuit can match the line resistance, which may be a mandatory condition in a high speed transmission system.

The voltages at nodes Out1 and Out2 can be expressed as in Equation 4 and Equation 5, respectively.

$$V_{out1} = \qquad \text{Equation 4}$$

$$\frac{1}{1+\dfrac{R_{F1}}{1+\dfrac{M}{N}}\cdot\dfrac{1}{R_L}}\cdot\dfrac{R_{F1}}{1+\dfrac{M}{N}}\cdot\dfrac{M}{N}i_{TX} + \dfrac{1}{1+R_L\dfrac{1+\dfrac{M}{N}}{R_{F1}}}\cdot v_{RX}$$

$$V_{out2} = \qquad \text{Equation 5}$$

$$\left(\frac{1}{R_{F1}}+\frac{1}{R_L}\right)\frac{M}{N}R_{F2}v_{out1}\big|_{v_{RX}=0} + \frac{1}{1+\dfrac{1+\dfrac{M}{N}}{R_{F1}}R_L}\cdot\dfrac{R_{F2}}{R_{F1}}v_{RX}$$

The output voltage $v_{out}$ at Node Out is given by Equation 6.

$$v_{out} = v_{out1} - kv_{out2} \qquad \text{Equation 6}$$

When Equation 4 and Equation 5 are introduced into Equation 6, it can be seen that if Equation 7 holds and k=1, then $v_{out}$ is described by Equation 8.

$$R_{F2} = k\dfrac{M/N}{2+\dfrac{M}{N}}R_{F1} \qquad \text{Equation 7}$$

$$v_{out} = \left(\dfrac{1}{1+R_L\dfrac{1+\dfrac{M}{N}}{R_{F1}}} + \dfrac{1}{1+R_L\dfrac{1+\dfrac{M}{N}}{R_{F1}}}\cdot\dfrac{R_{F2}}{R_{F1}}\right)v_{RX} \qquad \text{Equation 8}$$

Equation 8 shows that, in the above-mentioned conditions, a perfect cancellation of the transmit signal can be obtained. Because k=1, the transmit signal amplitude generated by $i_{TX}$ at Out2 is equal to the amplitude at Out1. In other words, for k=1 the signal to the input of the receive path is proportional with just the receive signal $V_{RX}$.

Moreover, if Equation 3 holds, then the output voltage expression can be simplified as in Equation 9.

$$v_{out} = \left(\dfrac{1}{2}+\dfrac{1}{2}\cdot\dfrac{R_{F2}}{R_{F1}}\right)v_{RX} \qquad \text{Equation 9}$$

In view of the above, certain embodiments of the present invention can include a circuit, such as the circuit shown in FIG. 1. The circuit can include a first feedback resistor, such as $R_{F1}$. The resistors of this circuit can be implemented as a single element, as a network of elements, or in any other desired way. Thus, a reference to a resistor can be understood as also including a reference to a collection of resistors having an equivalent resistance. For example, two resistors each having double the desired resistance can be connected in parallel and can be treated as a resistor with the desired resistance.

The circuit can also include a second feedback resistor, such as $R_{F2}$, coupled to the first feedback resistor. The circuit can further include a first set of M transistors, such as M1, coupled to the first feedback resistor. Sets of transistors in certain embodiments can include one or many transistors. The circuit can additionally include a second set of N transistors, such as M2, coupled to the second feedback resistor and to the first set of M transistors.

The circuit can be configured to cancel a transmitted signal at a receiver input based on a ratio of resistance values of the first feedback resistor and the second feedback resistor, and based on a ratio of M to N. This can be accomplished as outlined above, for example, at Equations 1 through 9. Moreover, the circuit can be configured to prevent all internal nodes from swinging more than a predetermined maximum amplitude.

The circuit can also include a scaling circuit, such as k, configured to scale an output of the second feedback resistor and the second set of N transistors. The scaling circuit can be configured to reduce or increase the output of the second feedback resistor. If a unit scaling is desired, optionally the scaling circuit can be omitted.

The circuit can further include a summer, such as Σ, configured to combine an output of the scaling circuit with an output of the first feedback resistor and the first set of M transistors. The summer can combine the amplitudes of the two outputs.

In the circuit, gates of the first set of M transistors can be directly coupled to gates of the second set of N transistors. Thus, operation of all of the transistors can be synchronized. The signal to the gates can be based on the transmitted signal.

The first feedback resistor can be directly coupled to the first set of M transistors. Similarly, the second feedback resistor can be directly coupled to the second set of N transistors. The first feedback resistor can be directly coupled to the second feedback resistor.

The circuit can additionally include a driver, such as A, configured to drive gates of the first set of M transistors and gates of the second set of N transistors, based on the transmitted signal. The driver may, for example, be or include an operational amplifier, an operational transconductance amplifier or any other desired amplifier.

In the circuit, the first set of M transistors can be connected to each other in parallel. Similarly, the second set of N transistors can be connected to each other in parallel.

Figure 2:
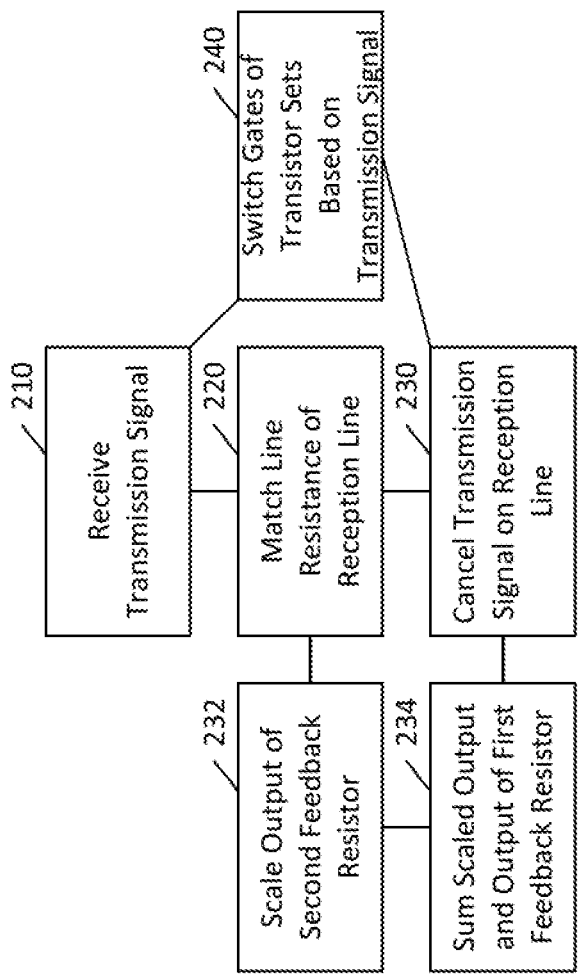
FIG. 2 illustrates a method according to certain embodiments of the present invention.

FIG. 2 illustrates a method according to certain embodiments of the present invention. The method of FIG. 2 may be performed by the exemplary circuit of FIG. 1 and equivalents thereof.

As shown in FIG. 2, the method can include, at 210, receiving a transmission signal. The method can also include, at 220, matching a line resistance of a reception line using a first feedback resistor and a ratio of transistor sets. The method can further include, at 230, canceling the transmission signal on the reception line using a ratio of a second feedback resistor to the first feedback resistor. The method can additionally include, at 240, switching gates of the transistor sets based on the transmission signal.

The method can additionally include, at 232, scaling an output of the second feedback resistor. The scaling can be performed as part of the canceling. The method can further include, at 234, summing the scaled output of the second feedback resistor with an output of the first feedback resistor. The summing can be performed as part of the canceling.

Certain embodiments of the present invention may be applicable to PHY interfaces at 1000 BT and 2.5 G speeds in 28 nm CMOS technology. Such interfaces may be employed, for example, in switches. However, certain embodiments of the present invention can be applied to any device that performs full duplex line transmissions.

One having ordinary skill in the art will readily understand that the invention as discussed above may be practiced with steps in a different order, and/or with hardware elements in configurations which are different than those which are disclosed. Therefore, although the invention has been described based upon these disclosed embodiments, it would be apparent to those of skill in the art that certain modifications, variations, and alternative constructions would be apparent, while remaining within the spirit and scope of the invention.

I claim:

1. A circuit, comprising:
   a first feedback resistor;
   a second feedback resistor coupled to the first feedback resistor;
   a first set of M unit transistors connected in parallel and coupled to the first feedback resistor; and
   a second set of N unit transistors connected in parallel coupled to the second feedback resistor and to the first set of M transistors;
   wherein the circuit is configured to cancel a transmitted signal at a receiver input based on a ratio of resistance values of the first feedback resistor and the second feedback resistor, and based on a ratio of M to N.

2. The circuit of claim 1, wherein the circuit is configured to prevent all internal nodes from swinging more than a predetermined maximum amplitude.

3. The circuit of claim 1, further comprising:
   a scaling circuit configured to scale an output of the second feedback resistor and the second set of N transistors.

4. The circuit of claim 3, further comprising:
   a summer configured to combine an output of the scaling circuit with an output of the first feedback resistor and the first set of M transistors.

5. The circuit of claim 1, wherein gates of the first set of M transistors are directly coupled to gates of the second set of N transistors.

6. The circuit of claim 1, wherein the first feedback resistor is directly coupled to the first set of M transistors.

7. The circuit of claim 1, wherein the second feedback resistor is directly coupled to the second set of N transistors.

8. The circuit of claim 1, wherein the first feedback resistor is directly coupled to the second feedback resistor.

9. The circuit of claim 1, further comprising:
   a driver configured to drive gates of the first set of M transistors and gates of the second set of N transistors, based on the transmitted signal.

10. The circuit of claim 9, wherein the driver comprises at least one of an operational amplifier or an operational transconductance amplifier.

11. The circuit of claim 1, wherein the first set of M transistors are connected to each other in parallel.

12. The circuit of claim 1, wherein the second set of N transistors are connected to each other in parallel.

13. A method for canceling a transmitted signal received by a circuit on a full duplex line, the method comprising:
   receiving the transmitted signal on the full duplex line;
   presenting the received transmitted signal to a non-inverting input of an amplifier;
   presenting an output of the amplifier to a first set of M transistors each having a gate coupled to the output of the amplifier, a drain coupled to the non-inverting input of the amplifier through a first feedback resistor, and a source coupled to ground; and
   presenting the output of the amplifier to a second set of N transistors each having a gate coupled to the output of the amplifier, a drain coupled to the non-inverting input of the amplifier through a second feedback resistor, and a source coupled to ground;
   wherein a ratio of the second feedback resistor to the first feedback resistor is selected to cancel the received transmitted signal.

14. The method of claim 13, further comprising:
   scaling an output of the second feedback resistor, wherein the scaling is performed as part of the canceling.

15. The method of claim 14, further comprising:
   summing the scaled output of the second feedback resistor with an output of the first feedback resistor, wherein the summing is performed as part of the canceling.

16. The method of claim 13, further comprising:
   switching gates of the transistor sets based on the transmission signal.

17. The method of claim 12 wherein the first feedback resistor and a ratio of M to N are both selected to match an output resistance of the circuit to a resistance of the full duplex line.

18. The method of claim 12 wherein presenting the received transmitted signal to a non-inverting input of an amplifier comprises presenting the received transmitted signal to one of an operational amplifier and an operational transconductance amplifier.

19. The circuit of claim 1 further comprising:
   an amplifier having a non-inverting input, an inverting input, and an output;
   and wherein
   the first set of M transistors each has a gate coupled to the output of the amplifier, a drain coupled to the non-inverting input of the amplifier through the first feedback resistor, and a source coupled to ground; and
   the second set of N transistors each has a gate coupled to the output of the amplifier, a drain coupled to the non-inverting input of the amplifier through the second feedback resistor, and a source coupled to ground.

* * * * *

UNITED STATES PATENT AND TRADEMARK OFFICE
CERTIFICATE OF CORRECTION

PATENT NO. : 10,528,324 B2
APPLICATION NO. : 15/784981
DATED : January 7, 2020
INVENTOR(S) : Dan Stiurca It is certified that error appears in the above-identified patent and that said Letters Patent is hereby corrected as shown below:

In the Claims

Column 6, Claim 13, Lines 4-5, 8 and 13, replace "a non-inverting" with --an inverting--
Column 6, Claim 17, Line 1, replace "claim 12" with --claim 13--
Column 6, Claim 18, Line 1, replace "claim 12" with --claim 13--
Column 6, Claim 18, Line 2, replace "a non-inverting" with --the inverting--
Column 6, Claim 19, Lines 6-7 and 11, replace "non-inverting" with --inverting--

Signed and Sealed this
Thirteenth Day of June, 2023

Katherine Kelly Vidal
*Director of the United States Patent and Trademark Office*